United States Patent [19]

Hicks et al.

[11] 4,146,810

[45] Mar. 27, 1979

[54] RADIATION HEATED ACCELERATION

[75] Inventors: William W. Hicks, Wappingers Falls; John H. Keller, Newburgh; Joseph H. Koestner, Hopewell Junction, all of N.Y.

[73] Assignee: International Business Machines Corporation, Armonk, N.Y.

[21] Appl. No.: 865,652

[22] Filed: Dec. 29, 1977

[51] Int. Cl.² ............................................. H01J 7/24
[52] U.S. Cl. ...................................... 313/11; 313/27; 313/47; 313/359; 313/360; 313/362; 250/309
[58] Field of Search .................. 250/309; 313/11, 27, 313/47, 359, 360, 362

[56] References Cited

U.S. PATENT DOCUMENTS 3,631,282   12/1971   Herb ............................... 313/47 X
4,011,449   3/1977    Ko et al. ........................ 250/309

Primary Examiner—Rudolph V. Rolinec
Assistant Examiner—Darwin R. Hostetter
Attorney, Agent, or Firm—Joseph C. Redmond, Jr.

[57] ABSTRACT

In an ion implantation apparatus, a beam defining member such as the acceleration plate is constructed such that the member is maintained at a temperature above the condensation point of the vapor emanating from the source of charged particles, thereby preventing the vapor from condensing on the member and providing a self-cleaning effect.

10 Claims, 2 Drawing Figures

RADIATION HEATED ACCELERATION

BACKGROUND OF THE INVENTION

The present invention relates to charged particle generating apparatus and, more particularly, to an ion implantation apparatus designed to prevent the source vapor materials from condensing on the cool surface of beam-defining member, e.g. the acceleration plate.

Ion implantation apparatus has been adapted for the microfabrication of large-scale integrated semiconductor circuits. For example, U.S. Pat. No. 4,011,449 issued Mar. 8, 1977 to Wen-Chuang Ko et al. describes an ion implantation apparatus adapted to implant impurities into a semiconductor wafer. In such implantation, ion beam emitted from an ion source is shaped and directed toward a target through a plurality of beam-shaping members arranged in well-known manner. Of them, the beam-shaping member that the beam first encounters upon leaving the heated ion source is called the acceleration plate. Conventionally, the acceleration plate is thick and rigid enough to contain mounting surfaces for attachments to an extractor mechanism and has beam-shaping apertures formed therein. Heretofore, no design consideration has been given to an arrangement and/or structure of the acceleration plate for maintaining it at a predetermined high temperature. We have found that the conventional apparatus, having 2mm thick copper as the acceleration plate, cannot maintain the plate at a temperature above the condensation point of the vapor to be implanted, because of the high thermal mass of the thick plate and low spectral emissivity of copper. If a material to be implanted with this apparatus is, for example, arsenic in the vapor state, it is undesirably deposited on the first cool surface, i.e. the acceleration plate, upon leaving the heated ion source. We have also discovered that the build-up of such deposits, after a period of time, begin to flake and cause arcing between the source and the acceleration plate, thereby significantly impairing the operation of the apparatus. One attempt of eliminating the arcing problem is, on a highly periodic basis, to clean the acceleration plate so as to remove the deposits. This makes the apparatus undesirable not only from a utility standpoint but there is an increased safety hazard incurred due to the frequency of cleaning.

SUMMARY OF THE INVENTION

Accordingly, it is an object of the present invention to provide an ion implantation apparatus in which the source vapor materials are prevented from depositing and accumulating on a beam-shaping or beam-defining member.

It is another object of the present invention to provide a charged particle generating apparatus in which the surface of the beam-defining member is heated and maintained at a temperature sufficiently high so as to prevent the deposition of condensation deposits.

It is still another object of the present invention to provide charged particle generation apparatus in which the heat radiating during operation of the apparatus is utilized to heat the beam-defining member so as to prevent condensation.

In general, the foregoing objects are achieved with a charged particle generating apparatus, with a source for generating a beam of charged particles, comprising a novel beam-defining member or means having a structure capable of being quickly raised to a temperature above the condensation point of the vapor emanating from the source, and including means for maintaining said surface substantially at said temperature.

More specifically, heat radiating from the charged particle source is utilized to heat the novel beam defining member including a layer of high spectral emissivity material which is thin enough to provide a low thermal mass structure. This thin layer is supported by a plate of low spectral emissivity material which is sufficiently thick to provide structural support.

With such a beam defining member, it has been found that, during the operation of the charged particle generating apparatus, sufficient radiant heat is generated from the charged particle source or ion source to heat the member to a temperature sufficient to prevent condensation. Normally, the time for the member to reach this temperature occurs during the heat up period of the source prior to implantation.

In operation, the radiant heat emanating from the source is absorbed by the layer of high emissivity material which heats up to a temperature above the condensation point and does so rapidly because the layer is thin. Preferably, this layer comprises a tantalum sheet of 0.25mm thickness, which has the spectral emissivity of approximately 0.5. Other materials include those materials which have a spectral emissivity greater than 0.4 and less than 1.0, such as graphite, titanium, and tungsten. To maintain the temperature in the layer, the supporting backplate is formed of a high temperature insulating material, such as ceramics, or metal adjacent the backside of the layer with, preferably, a small gap separating them in order to reduce heat conduction to the backplate. The gap prevents undesirable heat dissipation, especially when the backplate is metal, and allows the reflective surface of the backplate to reflect radiation back to the thin layer. This serves to stabilize the operating temperature of the thin layer. Preferably, the supporting backplate is copper but other low spectral emissivity materials may be used, such as stainless steel and ceramic. Alternatively, the backplate may be composed of a plurality of layers to form a radiation shield.

DESCRIPTION OF THE PREFERRED EMBODIMENTS

Figure 1:
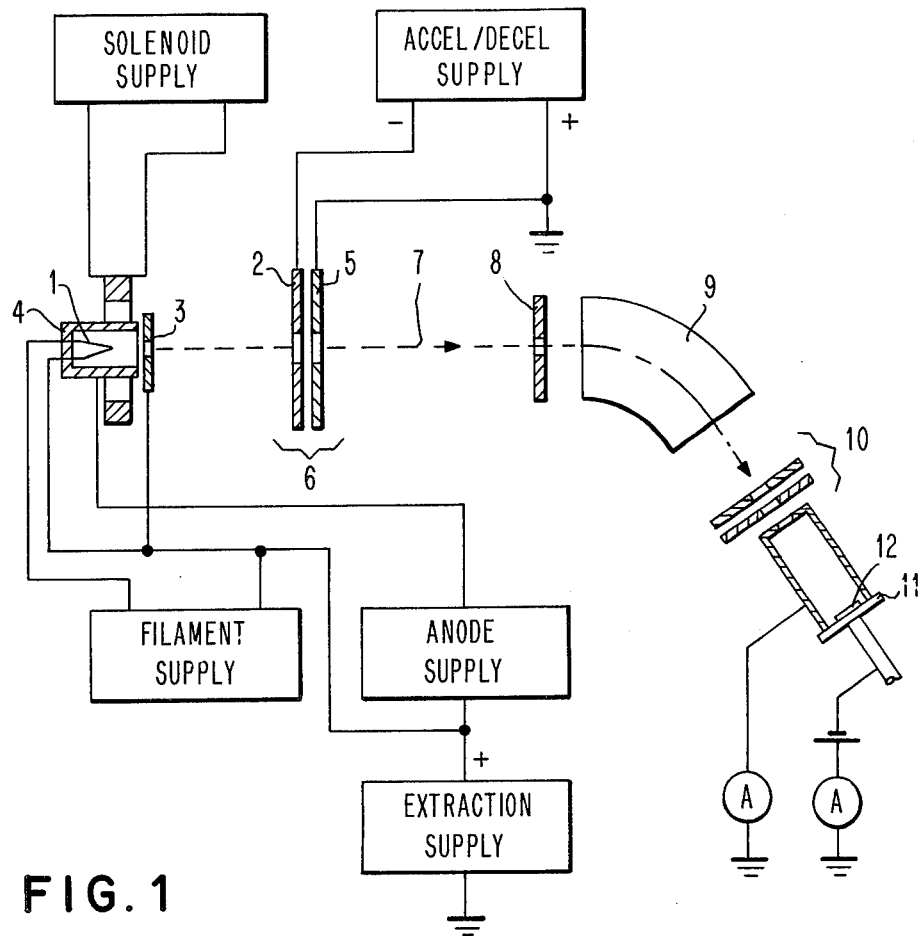
FIG. 1 discloses a schematic representation of an ion implantation apparatus incorporating the beam-defining means of the present invention.

Referring now to FIG. 1, the beam-defining means of the present invention will be described with respect to an acceleration/deceleration member of an ion implantation apparatus. It, however, should be understood that the principle of the present invention is equally applicable to a similar member of any other charged particle generation and/or utilization apparatus. It should also be recognized that the apparatus shown in FIG. 1 is schematic representative of the conventional ion implantation apparatus such as described in U.S. Pat. No. 3,756,862, U.S. Pat. No. 4,011,449, etc. The apparatus in FIG. 1 includes a conventional ion source 1, which may be any suitable high density source, although illustrated herein, a hot filament electron impact source is shown operating in an oscillating electron discharge mode. A vapor of the ions to be implanted is fed to the source 1 from a supply (not shown) exterior to the source 1. An ion beam is extracted from the source 1 in a conventional manner through an extraction electrode 2 via aperture 3. The electrode 2 is known as an acceleration electrode, is maintained at a negative potential by an acceleration/deceleration supply to extract ions from the source. On the other hand, an ion source electrode 4 is maintained at a positive potential by the extraction supply. Another plate of beam-shaping member known as deceleration electrode 5 is positioned opposite the acceleration electrode 2 and maintained at the ground potential. Acceleration electrode 2 and deceleration electrode 5 are formed with any desired shaped apertures, herein slit. It should be recognized that the bias voltages and the shape of the apertures can be varied in the operation of the apparatus by those skilled in the art.

The beam extracted from the ion source 1 by the electrode arrangement disclosed here is transmitted along a beam path generally indicated at 7 to an analyzing magnet 9 of conventional design. The beam is further defined in a conventional manner by apertured plates 8 and 10 located on either side of the magnet 9. The thus defined beam is directed to a target 11 on which is mounted a semiconductor wafer 12.

Figure 2:
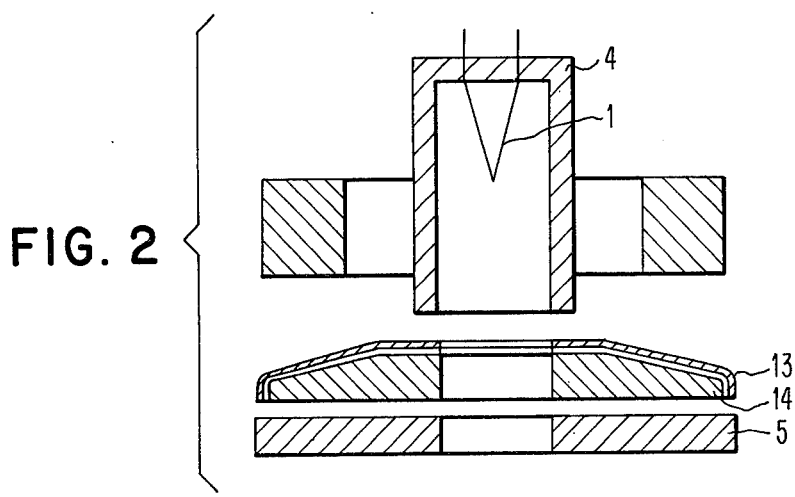
FIG. 2 is a partial diagrammatic sectional view of a beam-defining means in accordance with the present invention.

Now turning to FIG. 2, shown herein is the preferred self-cleaning embodiment of the present invention. As shown in FIG. 2, acceleration electrode 2 (FIG. 1) comprises a thin apertured layer 13 of high spectral emissivity material and a layer thin enough to provide a low thermal mass and backplate 14 of low spectral emissivity material which is thick enough to provide structural support. Deceleration elecrode 5 is also arranged behind the acceleration electrode, as in FIG. 1. The layer 13 is applied with the same potential, as the electrode 2 in FIG. 1, to perform the same extraction function as the electrode 2. Preferably, the layer is 0.25mm thick tantalum sheet which is thinner, by one order of magnitude, than a conventional copper electrode. The spectral emissivity for tantalum is about 0.5 in contrast of about 0.1 for copper. It should be recognized that the figures and the materials recited above are merely for illustrative purposes and depend on the specific design of the apparatus, operations, etc. The layer 13 is mounted in close proximity with a supporting backplate 14 of, herein, copper material, with a small gap maintained between the layer and the backplate. Herein, the layer 13 is fastened to the layer 14 with stainless steel screws (not shown), and because the two layers do not have planar surfaces there is only point contacts, thereby leaving a gap between them. This gap, which is desirable but not necessary, serves to effectively reduce heat conduction between the layer and the backplate. The backplate contributes to stabilizing the operating temperature of the acceleration plate, lends to structural strength, and contains the mounting surfaces for attachments to the appropriate mechanism. It should also be understood that any other materials than copper can be used for the backplate if they serve to cut the conduction/radiation from the backside of the thin layer and contribute to stabilization of the operating temperature of the layer. They may serve in a reflective capacity, such as copper, or a poor thermal conductor capacity, such as ceramic, or both capacities, such as stainless steel.

In operation, heat radiated from the ion source 1, contained within the electrode 4, reaches a surface of the acceleration plate 13 and supplies a heat energy to the plate. This radiant heat permits rapid heating of the tantalum sheet 13 due to the high spectral emissivity of tantalum and the low thermal mass of the thin sheet. The high reflectivity and/or poor thermal conduction of the backplate 14 and the gap between the opposite reflective surfaces keeps the sheet 13 at a temperature high enough so as to prevent the vapor from condensing and depositing on the surface of the sheet 13. The backplate 14, due to its low spectral emissivity, contributes to confining radiant heat received to the sheet 13 and also stabilizing the operating temperature of the acceleration electrode, as well as providing mechanical support. The structure of the acceleration electrode as shown in FIG. 2 utilizes the available heat radiated from the ion source to achieve a temperature sufficient to keep the electrode clean, and therefore, can be referred to as self-cleaning.

While the invention has been particularly shown and described with reference to the preferred embodiments thereof, it will be understood by those skilled in the art that various changes in form and detail may be made therein without departing from the spirit and scope of the invention.

What is claimed is:

1. In charged particle apparatus having a source of charged particles and a target toward which charged particles are directed, charged particle beam-defining means along the path from said source to said target comprising:
   a beam-shaping member having a beam-shaping aperture formed therein and capable of absorbing sufficient radiant heat from said source, so as to raise said member to a temperature above the condensation point of the vapor emanating from said source; and
   means for maintaining said member at a temperature above said condensation point.

2. The apparatus of claim 1 wherein said beam-shaping member includes a sheet of high spectral emissivity in face relationship with said source.

3. The apparatus of claim 1 wherein said sheet comprises tantalum.

4. The apparatus of claim 1 wherein said means for maintaining the member above the condensation point comprises a support adjacent said member having low spectral emissivity and/or poor thermal conductivity.

5. The apparatus of claim 4 wherein said support is slightly spaced from said sheet.

6. The apparatus of claim 4 wherein said support is formed of an insulative material.

7. The apparatus of claim 5 wherein said support is formed of material selected from the group consisting of copper, stainless steel, and ceramic.

8. The apparatus of claim 7 wherein said sheet is formed of a material selected from the group consisting of tantalum, titanium, and graphite.

9. The apparatus of claim 1 wherein said beam shaping member is an acceleration electrode.

10. The apparatus of claim 8 wherein said vapor includes arsenic.

* * * * *